(12) United States Patent
Battiston et al.

(10) Patent No.: US 6,411,075 B1
(45) Date of Patent: Jun. 25, 2002

(54) ELECTRONIC FREQUENCY MEASURING DEVICE AND ITS USE

(75) Inventors: Felice M. Battiston, Muttenz; Dominik M. Mueller, Liestal, both of (CH)

(73) Assignee: Nanosurf AG (CH)

(*) Notice: Subject to any disclaimer, the term of this patent is extended or adjusted under 35 U.S.C. 154(b) by 0 days.

(21) Appl. No.: 09/525,855

(22) Filed: Mar. 14, 2000

(30) Foreign Application Priority Data

Mar. 18, 1999 (EP) .............................................. 99810239

(51) Int. Cl.[7] .............................................. G01R 23/02
(52) U.S. Cl. .................................. 324/76.39; 324/76.23
(58) Field of Search .............................. 324/720, 751, 324/76.23, 76.39, 76.52, 132, 612, 615; 325/489; 328/133; 250/310

(56) References Cited

U.S. PATENT DOCUMENTS

| | | | |
|---|---|---|---|
| 4,007,363 A | * | 2/1977 | Lemmrich |
| 4,140,975 A | * | 2/1979 | Cochran |
| 4,413,181 A | * | 11/1983 | Feuerbaum |
| 4,437,058 A | * | 3/1984 | Kinoshita |
| 5,753,814 A | | 5/1998 | Han et al. |
| 5,763,283 A | * | 6/1998 | Cernosek |
| 5,784,161 A | * | 7/1998 | Bechstein |
| 6,157,037 A | * | 12/2000 | Danielson |
| 6,198,392 B1 | * | 3/2001 | Hahn |

FOREIGN PATENT DOCUMENTS

| | | |
|---|---|---|
| DE | 4328097 | 2/1995 |
| EP | 0551814 | 7/1993 |
| EP | 0661815 | 7/1995 |

* cited by examiner

*Primary Examiner*—Michael J. Sherry
*Assistant Examiner*—Trung Nguyen
(74) *Attorney, Agent, or Firm*—Bachman & LaPointe, P.C.

(57) ABSTRACT

The invention relates to the field of frequency measuring, in particular to extremely accurate difference frequency measuring as it is used in the area of measuring instruments, e.g. in scanning atomic force microscopes or other scanning probe microscopes, or in the area of thermogravimetry for determining extremely small masses in the ng-range. The invention relates in particular to the principle of such a hybrid frequency measuring device or frequency detector, i.e. a frequency measuring device or frequency detector comprising both digital and analog components or groups of components. The invention also relates to an advantageous use of such a frequency detector for evaluation of the frequency measurements of a scanning probe microscope. A frequency measuring arrangement can be at least partly integrated in a measuring head of a scanning probe microscope, thus enabling a robust, and at the same time sensitive, measuring arrangement.

15 Claims, 2 Drawing Sheets

ELECTRONIC FREQUENCY MEASURING DEVICE AND ITS USE

BACKGROUND OF THE INVENTION

1. Technical Field of the Invention

The invention relates to the field of frequency measuring, in particular to extremely accurate difference frequency measuring as it is used in the area of measuring instruments. Such accurate frequency measurements are for example required in scanning atomic force microscopes or other scanning microscopes, so-called scanning probe microscopes if their oscillation characteristics are used for measuring. In the area of thermogravimetry they can be used to determine extremely small masses in the ng-range. The invention relates in particular to the principle of a hybrid frequency measuring device or frequency detector, i.e. a frequency measuring device or frequency detector comprising both digital and analog components or groups of components. The invention also relates to a particularly advantageous use of such a frequency detector for evaluating the frequency measurements of a scanning probe microscope. Thus, for example, a frequency measuring arrangement according to the invention can be at least partially integrated in a measuring head of a scanning probe microscope, thus enabling a robust, and at the same time sensitive, measuring arrangement which provides advantages compared to the state of the art.

2. State of the Art

In scanning probe microscopy, often an electronic device is used as a probe which records the interaction between the probe and a subject being measured, i.e. the specimen. To this effect, essentially two methods are being used: either contact measuring where the static influencing of the probe by the specimen is measured, or non-contact measuring where the influencing of the probe by the specimen is recorded as a resonance frequency change in the probe. However, since most of the time these frequency changes are very small in relation to the uninfluenced free resonance frequency of the probe, the requirements of the sensor electronics are high. In this case, the sensor electronics must be in a position to convert the small signal changes of the probe into a voltage or a numeric value which can be further processed. Obviously a host of problems need to be solved in this process. There are not only temperature-dependent factors and problems with long-term stability but also adequate measuring resolution and linearity need to be achieved, and even tolerances of the components must be taken into account.

Such a solution has for example been described by T. Albrecht in the Journal of Applied Physics, Vol. 69, 1991, pp 668ff, in the paper "Frequency Modulation Detection Using High-Q Cantilevers for Enhanced Microscopy Sensitivity". The method described there attempts to determine the resonance frequency change of the sensor by means of a known filter characteristic, usually a band pass or low pass. In so doing, the frequency dependence of the transfer characteristic of the filter used is used to obtain a measurement value via the amplitude change of the filter output signal when changing the frequency of the filter input signal. While with this method or with such sensor electronics it is possible to achieve a measuring resolution which is sufficiently high, the linear relationship between the frequency change of the probe and the output value of the sensor electronics is however only present in a narrow band and is only approximate. Furthermore, the temperature independence of such an arrangement is not always satisfactory; it reacts strongly to component tolerances. In addition, such sensor electronics can be adapted only with difficulties to various sensors with widely differing resonance frequencies and/or resonance frequency shifts because usually several inductivities and/or capacities matched to each other need to be changed.

Another attempt at solving the task described comprises frequency measurement by means of an analog phase-locked-loop (PLL) component. Such an attempt has for example been described by Roland E. Best in "Phase-Locked Loops, Theory, Design and Applications", 1st ed., McGraw-Hill, New York, 1984, Chapter 2. There, a frequency signal emanating from a transmitter is measured by means of an analog PLL. The already processed transmitter oscillation is used as an input signal of the PLL phase detector while the VCO control signal, i.e. the voltage controlling the oscillator of the PLL serves as an output value of the electronics and is used as a measure for the frequency change of the transmitter. Such an arrangement provides quite good linearity and good noise suppression and the component tolerances are not too critical. However, good measuring frequency is only achieved within a limited frequency measuring range which means that the range of applications is limited. Furthermore, temperature stability and long-term stability of such an arrangement can only be achieved at considerable expense as is the case with most analog circuits. Moreover, such an arrangement is difficult to adapt to different sensors with strongly differing resonance frequencies and/or different resonance frequency shifts.

A third attempt at a solution is provided by C. Loppacher et al in "Fast Digital Electronics for Application in Dynamic Force Microscope Using High-Q Cantilevers", Applied Physics A, pp 66–215, 1998. This provides a description as to how the frequency signal and/or the phase shift of a sensor can be measured by means of a purely digital PLL. This design solves most of the problems of the above-mentioned two methods. It is insensitive to temperature, it is stable in the long term, linear, easily adaptable to various sensors and almost independent of component tolerances. However, it requires considerable expenditure in components space and electrical energy which not only results in high cost but also renders such a solution unusable for applications which demand small size and/or low energy consumption. Of course the high costs mentioned also have a prohibitive effect.

A further method is described in the patent application WO 96/24026, "Tapping AFM with Phase or Frequency Detection". This attempt shows how distance measuring to the specimen can be achieved by means of an oscillating probe, with the dependence of the amplitude of the probe oscillation from the distance to the specimen being exploited. By means of amplitude measuring it is then possible to derive the distance to the specimen. One problem of this method is due to the fact that in the case of probes of high quality Q, the amplitude changes only very slowly and that consequently measuring is also very slow. This renders the described method unusable for all measurements where speed is important, i.e. unusable for the majority of applications. Moreover the relationship between the probe amplitude and the resonance frequency is extremely complicated which renders the interpretation of the measured data considerably more difficult.

The aforementioned thus leads to the object of this invention which is to disclose a method and a device, i.e. a circuit, which as far as possible achieves all the advantages of the latter fully-digital attempt at considerably reduced technical and financial expenditure. Adequate independence of temperature fluctuations and component tolerances are to be achieved, as are good long-term stability, the necessary linearity and measuring resolution. In other words, a solution is to be found which provides practically the same advantages as the last-described method, but without the problems of energy, space and cost.

SUMMARY OF THE INVENTION

In a nutshell, the invention is a frequency detector which in a useful and thus inventive way combines analog and digital design so as to achieve optimal effect with minimized technical and financial expenditure. In principle the detector works in an analog way in the range where high reaction speeds and/or complicated mathematical calculations are required, while it works digitally in the range where high accuracy, in particular frequency accuracy and/or stability are required, with the detector comprising the respective components.

It is a particular advantage that some of the necessary components, in particular analog components, are readily available in the market and are therefore available in good quality at economical prices. At the same time the entire digital part can for example be implemented by means of a microprocessor and by respective software, thus providing almost unlimited flexibility.

While hybrid circuits are known in principle, e.g from patent application EP 661 815, "Frequency Synthesizer", such a circuit can only generate one frequency and can therefore not fulfil the above-mentioned task, i.e. for example carrying out highly precise and fast measurement of an input frequency relative to a reference frequency.

In a preferred embodiment of the invention which is subsequently mentioned, there is a further advantage from a particularly advantageous arrangement of the A/D transition. It can be designed so that one and the same frequency detector practically at the same time can provide both an analog and a digital output signal which in turn ensures a flexibility which could not be achieved with any of the previous solutions.

Furthermore, the invention can be very simply adapted and can be simply modified for the use of various sensors, e.g. apart from self-oscillating sensors, extraneously driven sensors, with the phase-correct and frequency-correct drive being able to be delivered by a circuit according to the invention. An embodiment for this modification is also shown below.

In summary, and without making any claims for being exhaustive, the invention can be described as an electronic frequency measuring device which is particularly suitable for precision measuring of small frequency differences and which features an advantageous hybrid design, with the device essentially comprising three groups of components:

1. An analog input group which is supplied with an input frequency to be measured and an analog feedback signal, said input group forming an analog difference signal therefrom, which signal depicts the difference between the input frequency and a given reference frequency;
2. A digital mixed group which forms a sum frequency from the difference signal and the reference frequency;
3. An analog output group which forms the feedback signal from the digital sum frequency.

In particular the option of outputting a synchronised frequency control signal, e.g. for driving a non-self-oscillating sensor, is provided as an expansion.

Overall, the solution presented here essentially provides the same advantages as does the last-mentioned method of the state of the art, except that this solution also elegantly solves the there presented problems of energy, space, and cost.

Further advantageous embodiments result from the following description of the embodiments.

BRIEF DESCRIPTION OF THE DRAWINGS

Below, two embodiments of the invention are described in more detail in conjunction with the drawings, as follows.

DETAILED DESCRIPTION OF PREFERRED EMBODIMENTS

LIST OF REFERENCES

Figure 1:
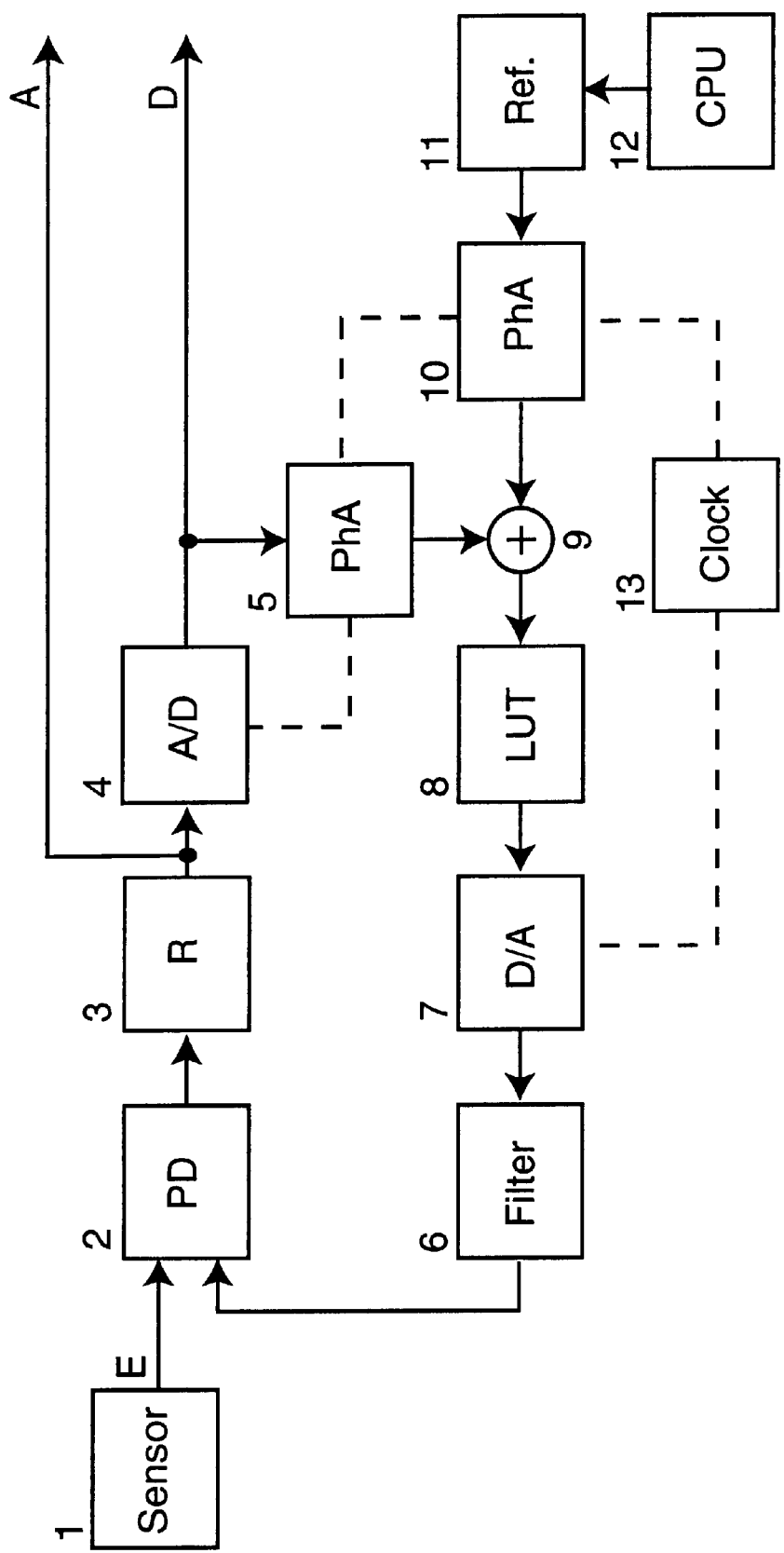
FIG. 1 shows a first embodiment of the invention.
Figure 2:
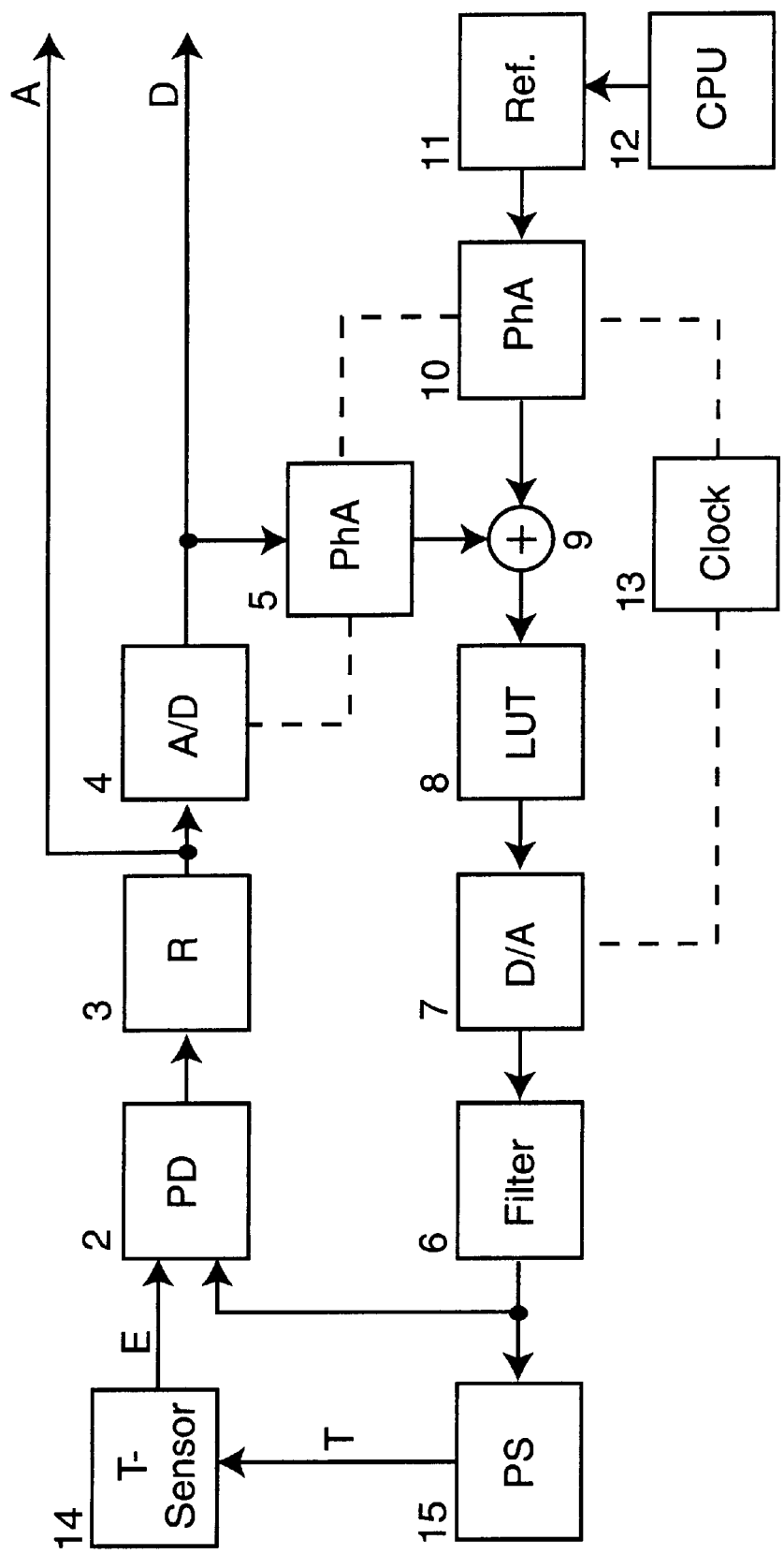
FIG. 2 shows a second, modified embodiment.

FIG. 1
  E Input line
  A Analog output line
  D Digital output line
  1 Self-oscillating sensor
  2 Phase detector
  3 Controller
  4 A/D converter
  5 First phase accumulator
  6 Filter
  7 D/A converter
  8 Lookup table
  9 Adding element
  10 Second phase accumulator
  11 Register for reference frequency
  12 Computer
  13 System clock
FIG. 2 (in addition)
  T Driver line (for sensor)
  14 Driven sensor
  15 Phase shifter FIG. 1 shows a block diagram of a circuit described below as a first embodiment of the invention.

As described above, the circuit disclosed is to be used to measure the frequency deviation of an analog input signal which is the output signal of a sensor 1, in relation to a reference frequency, i.e. a difference frequency. In this, the disadvantages of the known above-mentioned solutions are to be avoided.

The frequency to be measured is fed as an analog input signal via-the input line E of the circuit shown in FIG. 1. Via analog output A an analog output signal is provided, with a corresponding digital output signal being provided via digital output D. The circuit comprises a number of components. or elements, essentially a phase detector 2, a controller 3, an analog-to-digital converter or transducer 4, one or two phase accumulators 5 and/or 10, a low pass filter 6, a digital-to-analog converter 7, a lookup table 8, a system clock 13 preferably quartz-stabilized, a reference register 11 or another memory for storing the reference frequency, and an interface to a computer 12. The lookup table 8 like any of the other elements can also be arranged elsewhere in the circuit, for example as a separate component. Similarly, the computer interface 12 can also be replaced by a processor integrated in the circuit.

The electrical input signal to be measured, an analog oscillation, is fed to the circuit from the self-oscillating oscillating sensor 1 via input line E. The phase detector 2 generates a low frequency signal proportional to the phase difference between the analog input signal and the signal present at the output of the low pass filter 6. The output signal of the phase detector, i.e. the phase error, is fed to the controller 3. If the controller 3 is used as a pure proportional controller, a permanent phase error results. If on the other hand a controller with an integral component is used, this phase error becomes zero. In the present example a proportional controller is used. The analog signal at the output of controller 3 now corresponds to the frequency deviation between the frequency of the analog input signal at E and the reference frequency stored in register 11. It can only be used as an analog signal via output line A or, behind the A/D converter 4, as a digital signal on output line D. Examples mentioned above are signal evaluation of scanning probe microscopes or signal evaluation in thermogravimetry.

From the digitized frequency deviation, the first phase accumulator 5 forms a digital phase deviation which is added to the reference frequency accumulated in the second phase accumulator 10. By means of the lookup table 8, which usually contains the digital sine values associated with digital sawtooth values (as generated by the phase accumulators) and by means of the topped digital to analog converter 7, an analog sine oscillation is generated.from it, whose course can be smoothed by the low pass filter 6. Due to the provided quartz-stabilized system clock 13, which clocks the phase accumulators 5 and 10 as well as the converters 4 and 7, the signal at the output of the lowpass filter 6 is highly temperature-insensitive with very good long-term stability.

The circuit shown in FIG. 1 can also be varied such that only a single phase accumulator behind the adding element 9 is provided in which the required phase accumulation is carried out after summation. The same applies to the circuit shown in FIG. 2.

It is also possible to at least partially implement the digital part of the circuit, i.e. in particular the phase accumulators 5 and 10, the system clock 13, the lookup table 8 and the register 11 for the reference frequency, on a digital computer or by means of a Direct Digital Synthesizer (DDS). In particular a solution comprising a DDS seems advantageous because such DDSs are commercially available as integrated circuits.

Although calculating the entire circuit poses no difficulty to the expert, a few details of typical frequencies and limit values are provided. For example a typical self resonance of a sensor for a scanning probe microscope is around 32 kHz. A matching pulse frequency of the system clock 13 is then 24 MHz. The lookup table required for this would have a size of approximately 4000 entries. The bit depths of the two converters are between 10 and 16 bit; the bus width of a phase accumulator is approximately 32 bit.

As mentioned above, a further option for measuring the resonance frequency shift comprises the driving of a sensor with an external frequency. A corresponding sensor then generates a phase-shifted output signal whose phase shift depends on the resonance frequency of the sensor. Thus with a modified version of the circuit described above, the resonance frequency of the sensor can be measured.

FIG. 2 shows a respectively modified circuit as a block diagram where the externally driven sensor 14 has replaced the self-oscillating sensor 1 of FIG. 1 and a phase shifter 15 has been added as a new element.

The phase shifter 15 generates the driving frequency for sensor 14 from the output signal of the low pass filter 6 which generates an analog sine oscillation as described above. Sensor 14 picks up this frequency via driver line T and from it generates an analog output oscillation of the same frequency but with more or less phase shift, according to the frequency transmission behavior of sensor 14. This signal on input line E is compared by the phase detector 2 with the original phase position of the signal at the output of low pass filter 6 and a phase error signal is generated which is transmitted to controller 3. Said controller 3 is here typically implemented as a controller with integral component. Thus the signal which drives sensor 14 is always adjusted on line T such that the phase difference at the inputs of the phase detector 2 equal zero. If now the phase shifter 15 is set such that it exactly compensates the phase shift of sensor 14 at resonance frequency, then the controller 3 at its output again, as described above in the context of FIG. 1, generates an analog signal which exactly reflects the frequency difference between the reference frequency in register 11 and the resonance frequency of sensor 14. Here again, a numerical form of this frequency difference is obtained at the output of A/D converter 4.

When compared to the first version described in the context of FIG. 1, this method provides the advantage that with it, it is very simple to use sensors with several resonance frequencies because setting different frequencies obviously does not pose a problem. It is now also possible without any problems to use sensors which can only be operated with great difficulty or not at all as self-oscillating sensors, but which for other reasons are suitable for the intended use. Examples of this are sensors with resonance frequencies in close proximity to each other, or arrangements comprising several sensors which are operated in the time method or frequency multiplex method and which are evaluated by a common detector circuit.

Of course this simple and robust circuit can be modified for the same or similar operation. This should not pose any difficulty to a person skilled in the art. Such variations are to be encompassed by the following claims.

What is claimed is:

1. An electronic frequency measuring device, in particular for precision measuring of small frequency differences, for analog signals provided by a sensor, which comprises:

an analog input group which is supplied with an input frequency to be measured and an analog feedback signal, said input group forming an analog difference signal therefrom, which signal depicts the difference between the input frequency and a given reference frequency;

a digital mixing group which determines the deviation of said difference signal from said reference frequency as a digital frequency difference; and an analog output group which forms said feedback signal from said digital frequency difference.

2. The electronic frequency measuring device according to claim 1, wherein the analog input group comprises a frequency comparator and a controller whose output is connected to an analog-to-digital converter;

including at least one of (1) the output of said controller comprising an analog output of the frequency measuring device, and (2) the output of the analog to digital converter forming a digital output of the frequency measuring device.

3. The electronic frequency measuring device according to claim 2, wherein the frequency comparator in the analog input group is a phase error detector.

4. The electronic frequency measuring device according to claim 2, wherein the controller which forms part of the analog input group and whose exit is connected to an analog-to-digital converter is one of a PI controller, a proportional controller, and an integral controller.

5. The electronic frequency measuring device according to claim 2, wherein
the analog input group comprises an oscillating sensor providing an analog signal.

6. The electronic frequency measuring device according to claim 5, wherein
the oscillating sensor is a self-oscillating sensor.

7. The electronic frequency measuring device according to claim 1, wherein
the digital mixing group comprises at least one stored reference frequency;
and in addition at least one phase accumulator for accumulating at least one of (1) digital values of the reference frequency and (2) the difference frequency; and
a table for determining a current value of a periodic function which value corresponds to the current phase value of a determined frequency signal.

8. The electronic frequency measuring device according to claim 1, wherein
the digital mixing group comprises at least one stored reference frequency;
and in addition an adding element for adding up digital values of said reference frequency and the difference frequency;
a phase accumulator for accumulating the added-up said digital values; and
a table for determining a current value of a periodic function which corresponds to the current phase value of a determined frequency signal.

9. The electronic frequency measuring device according to claim 1, wherein
the analog output group comprises a digital to analog converter whose output is connected to a filter which generates the analog feedback signal.

10. The electronic frequency measuring device according to claim 9, wherein
said filter is a low pass filter.

11. The electronic frequency measuring device according to claim 9, wherein
a phase shifter is provided which is connected to the filter of the analog output group and which generates an out-of-phase output signal for operating a sensor.

12. The electronic frequency measuring device according to claim 11, wherein
said sensor is a non self-oscillating sensor.

13. The electronic frequency measuring device according to claim 1, wherein
a stable system clock generator is provided which pulses at least one of (1) at least one phase accumulator and (2) at least one of converters.

14. The electronic frequency measuring device according to claim 1, wherein
said frequency measuring device forms part of a scanning probe microscope system.

15. The electronic frequency measuring device according to claim 14, wherein
said frequency measuring device is at least partially integrated in said system.

* * * * *